United States Patent [19]

Ibuka et al.

[11] Patent Number: 5,254,176
[45] Date of Patent: Oct. 19, 1993

[54] METHOD OF CLEANING A PROCESS TUBE

[75] Inventors: Shigehito Ibuka, Tokyo; Chitoshi Nogami, Nara, both of Japan

[73] Assignees: Tokyo Electron Limited, Tokyo; Iwatani International Corporation, Osaka, both of Japan

[21] Appl. No.: 829,508

[22] Filed: Feb. 3, 1992

[51] Int. Cl.$^5$ .................. C03C 23/00; B08B 7/00; B08B 9/02
[52] U.S. Cl. .................. 134/2; 134/3; 134/21; 134/22.11
[58] Field of Search .................. 134/2, 3, 21, 22.11

[56] References Cited

U.S. PATENT DOCUMENTS

| | | | |
|---|---|---|---|
| 4,749,440 | 6/1988 | Blackwood et al. | 134/3 |
| 4,975,144 | 12/1990 | Yamazaki et al. | 118/50.1 |
| 5,011,705 | 4/1991 | Tanaka | 134/1 |

FOREIGN PATENT DOCUMENTS 0032538 2/1990 Japan .

OTHER PUBLICATIONS

Saito et al., "Plasmaless Cleaning Process of Silicon Surface Using Chlorine Trifluoride", Mar. 19, 1990, *Applied Physics Letter*, vol. 56, No. 12, pp. 1119–1121.

Ibbotson et al., "Selective Interhalogen Etching of Tantalum Compounds and Other Simiconductor Materials", Apr. 15, 1985, *Applied Physics Letter*, vol. 46, No. 8, pp. 794–796.

Ibbotson et al., "Plasmaless Dry Etching of Silicon with Fluorine-Containing Compounds", Nov. 15, 1984, *Applied Physics Letter*, vol. 56, No. 10, pp. 2939–2942.

*Primary Examiner*—Theodore Morris
*Assistant Examiner*—Zeinab El-Arini
*Attorney, Agent, or Firm*—Oblon, Spivak, McClelland, Maier & Neustadt

[57] ABSTRACT

A method of cleaning the process tube of the CVD apparatus comprising carrying silicon wafers out of the process tube, making temperature in the process tube lower enough than the process temperature, that is, equal to or higher than room temperature, and supplying cleaning gas, in which $ClF_3$ is contained, into the process tube to react with poly-silicon and amorphous silicon (Si) stuck to that portion of the inner wall of the process tube which is not in the uniformly-heated zone in the process tube, whereby the matters stuck can be removed from the inner wall of the process tube for a shorter time.

14 Claims, 4 Drawing Sheets

METHOD OF CLEANING A PROCESS TUBE

BACKGROUND OF THE INVENTION

1. Field of the Invention

The present invention relates to a method of cleaning a process tube, particularly capable of efficiently removing low density films to consist chiefly of silicon or silicon system compound from an inner wall of the process tube and a surface of other members.

2. Description of the Related Art

Usually in the course of manufacturing semiconductor devices, normal pressure or pressure-reduced CVD apparatuses are used to form on each of semiconductor wafers one of films of the poly-crystal-silicon system (Poly-Si), silicon nitride (SiN) system, silicon oxide ($SiO_2$) system and tungsten silicide (WSix) system.

At the process of forming the film of the $SiO_2$ system compound on the wafers, for example, the wafer boat is loaded into the process tube of the pressure-reduced CVD apparatus and heated there under reduced pressure. The mixture of $SiH_4$ and $O_2$ gases is then introduced into the process tube to form the film of $SiO_2$ on the silicon wafers. Upon loading and unloading the wafer boat into and out of the process tube in this case, the process tube is heated to a temperature substantially equal to the film-forming process temperature.

When the above-described film-forming process is carried out, $SiO_2$ adheres to the inner wall of the process tube and to other quartz-made tools. When this layer of $SiO_2$ develops on the inner wall of the process tube as the film-forming process is repeated, it peels off the inner wall, scattering its particles in the process tube.

Particularly upon loading and unloading the wafer boat into and out of the process tube, more particles scatter in the process tube at and near the opening (inlet) thereof. The scattering particles come to adhere to the wafers, thereby lowering the productivity of the wafers. This is because temperature in the process tube becomes lower at and near the opening of the tube than that at the uniformly-heated zone in the process tube so that amorphous products reacted of low density can be created there. In other words, the reason resides in that the force with which these amorphous products reacted of low density adhere to the inner wall of the tube is quite smaller. They therefore peel off and drop from the inner wall even when they are slightly contacted with other things and slightly vibrated together with the tube.

Japanese Patent Disclosures Sho 64-17857 and Hei 1-92385 disclose methods of plasma cleaning the reacted products stuck to the inner wall of the process tube. According to these methods, the reacted products stuck are removed by dry etching.

In the case this plasma dry etching is used, however, coils and electrodes must be located around the process tube to generate plasma. These coils and electrodes disturb the forming of the uniformly-heated zone in the process tube at the time of the film-forming process. In addition, the process tube must be detached from the apparatus itself upon cleaning the process tube. This process tube is quite heavy and it takes a long time to detach the tube from the apparatus and to clean it. Usually, the apparatus must be stopped for 24 hours or more upon cleaning the inner wall of the tube. This causes the operating efficiency of the apparatus to be lowered to a great extent. Particularly when the size of wafers to be processed is expected to change from 6 inches to 8 inches in the near future, the process tube will be larger-sized, thereby making it more difficult to detach the process tube from the apparatus itself.

$ClF_3$ gas is high in reaction. When it is used as cleaning gas, therefore, it can be expected that the rate of etching the reacted products becomes quite high at the time of the cleaning process. However, those reacted products stuck to that portion of the inner wall of the process tube which is in the uniformly-heated zone (where the wafers are film-forming-processed) are quite high in density. Even when $ClF_3$ gas is used, therefore, the reacted products cannot be fully removed for a short time unless they are etched under high temperature. Further, the process tube has a thickness up to about 5 mm. When the etching rate is set too high, therefore, the process tube itself may be etched, and the thickness of the process tube decreases. As a result, the process tube is liable to bread off.

SUMMARY OF THE INVENTION

The object of the present invention is therefore to provide a method of cleaning the process tube, capable of removing reacted products from the inner wall of the process tube and also from supports for the wafer boat and others to such an extent that they are prevented to scatter their particles in the process tube.

The inventors of the present invention arranged 200 sheets of semiconductor wafers at the uniformly-heated zone in the process tube and they applied the film-forming-process to the wafers thus arranged. When the process was repeated certain times in this manner, they have found that the product (or poly-silicon, for example) deposited to the inner wall of the process tube in the uniformly-heated zone hardly peels off the inner wall because it is high in density. They have also found that the product (or amorphous silicon, for example) deposited to the inner wall of the process tube not in the uniformly-heated zone but at and near the opening of the tube is likely to peel off because it is low in density. The present invention is based on their these findings.

According to an aspect of the present invention, there can be provided a method of cleaning an inner wall of the process tube and objects support members comprising, taking out the objects processed in the process tube; making temperature in the process tube lower enough than the process temperature, that is, equal to or higher than room temperature; and supplying or cleaning gas in which $ClF_3$ is contained into the process tube to react with a contaminant deposited to the inner wall of the process tube and also to supports for the objects to be processed.

The contaminant of low density can be thus removed from the inner wall of the process tube which is not in the uniformly-heated zone for a shorter time.

According to the cleaning method of the present invention, the temperature in the process tube is made lower enough than the process temperature e.g. lower than 400° C. Further, the cleaning gas which is formed by diluting $ClF_3$ gas by inactive gas such as nitrogen gas to an appropriate concentration of 20 volume %, for example, is then introduced into the process tube. It is preferable in this case that $ClF_3$ gas of 20±5 volume % is contained in the cleaning gas. When the cleaning conditions are selected in this manner, it can be avoided that the wall of the process tube is over etched. This enables the process tube to be cleaned without shortening the life of the process tube.

In order to prevent the wall of the process tube from being over etched, it is preferable to keep the cleaning temperature as low as possible or to lower it substantially to room temperature.

Further, the products deposited as described above can be removed from the inner wall of the process tube without generating plasma in the process tube. This makes it unnecessary to detach the process tube from the apparatus. This also enables the cleaning process to be carried out at an appropriate timing after the film-forming process.

The process tube is made of quartz or SiC and it may be either of hot wall type o cold wall type. The hot wall type process tube has a resistant heater to directly heat the tube wall. The cold wall type process tube has an induction heating lamps to indirectly heat the wafers in the process tube.

From the viewpoint of forming film on the wafers, it is advantageous that pressure in the process tube is made as low as possible. In order to increase the etching rate at the time of the cleaning process, however, it is advantageous that the pressure in the process tube is made as high as possible. From these reasons, it is preferable to set the pressure in the process tube lower than 2 Torr, more preferably, higher than 0.1 Torr.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A case where a cleaning method of the present invention is applied to a horizontal batch type CVD apparatus will be described below with reference to the accompanying drawings.

Figure 1:
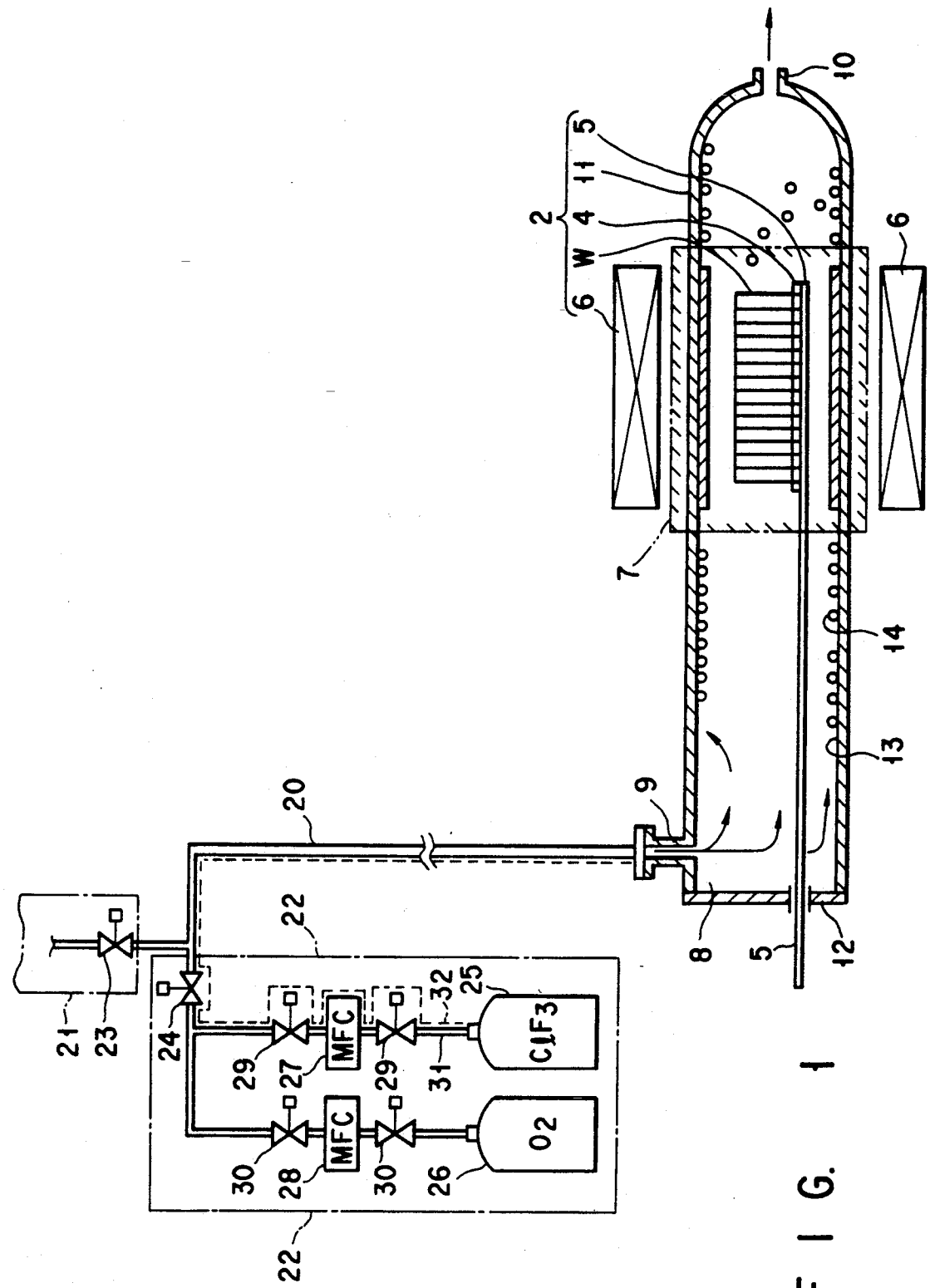
FIG. 1 is a partly- and vertically-sectioned view showing a process tube of the horizontal type CVD apparatus provided with a cleaning gas supply system.

As shown in FIG. 1, a horizontal process tube 11 is housed horizontal in a process section 2 of the CVD apparatus. A wafer boat 4 is loaded into the horizontal process tube 11 by a fork 5. A loading system (not shown) is connected to the fork 5. 200 sheets of silicon wafers W are housed in the wafer boat 4. The process tube 11, the wafer boat 4 and the fork 5 are made of quartz and the process tube 11 has an average thickness of 5 mm.

A coil heater 6 is located outside the process tube 11, enclosing a uniformly-heated zone 7 in the process tube 11. The coil heater 6 is connected to a variable AC power supply (not shown), serving to uniformly heat the 200 wafers W to a predetermined temperature or 800° C., for example. The uniformly-heated zone 7 is set a little larger than the area the wafers W occupy in the process tube 11.

A gas supply inlet 9 through which process gas, a mixture of gases such as $SiH_4$ and $N_2O$, is supplied into the process tube 11 is formed in that upper portion of the process tube 11 which is adjacent to an opening 8. An outlet 10 is formed in another end of the process tube 11. The outlet 10 is communicated with an exhaust system (not shown) which includes a dry pump of the oil-free type. This exhaust system also has a means (not shown) for appropriately adjusting the amount of gas exhausted, in such a way that only the amount of gas introduced can be exhausted from the process tube 11 through the outlet 10.

The gas supply inlet 9 is communicated with two gas supply sections 21 and 22 through a pronged pipe 20. One gas supply section 21 has tanks (not shown) for monosilane ($SiH_4$) and nitrous oxide ($N_2O$). Each of these tanks is provided with a flow rate controller, which serves to mix $SiH_4$ and $N_2O$ in the pipe 20 at a predetermined rate. This mixture of $SiH_4$ and $N_2O$ gases is introduced, as the process gas, into the process tube 11 through the gas supply inlet 9.

The other gas supply section 22 has tank 25 for chlorine trifluoride ($ClF_3$) and oxygen ($O_2$). $O_2$ gas is used as carrier and dilution gas and $ClF_3$ gas as etching (cleaning) gas.

Mass flow controllers 27 and 28 are attached to the gas supply sources 25 and 26, respectively. Valves 29 are located up- and down-stream the MFC 27. Valves 30 are also located up- and down-stream the MFC 28. The flow rates of $ClF_3$ and $O_2$ gases are adjusted by MFCs 27 and 28, so that $ClF_3$ and $O_2$ gases can be so mixed as to dilute $ClF_3$ gas to a predetermined concentration. The mixed gases in which $ClF_3$ gas has been thus diluted to the predetermined concentration are supplied from the cleaning gas supply system 22 into the pipe 20.

A pipe line 20, 31 for the $ClF_3$ gas supply source 22 is wrapped by a tape heater 32. This tape heater 32 has a heating power source (not shown). This enables $ClF_3$ gas in the pipe line 20, 31 to be heated. When $ClF_3$ gas having a boiling point of 11.75° C. is heated by the tape heater 32, it can be prevented from becoming liquidized in the pipe line 20, 31. This is intended mainly to prevent the pipe line 20, 31 from being corroded.

A cap 12 for air-tightly closing the process tube 11 is associated with the loading system. When the fork 5 is forwarded while supporting the wafer boat 4, the wafer boat 4 is loaded into the uniformly-heated zone 7 in the process tube 11 and the cap 12 is fitted into the opening 8 of the process tube 11.

Figure 2:
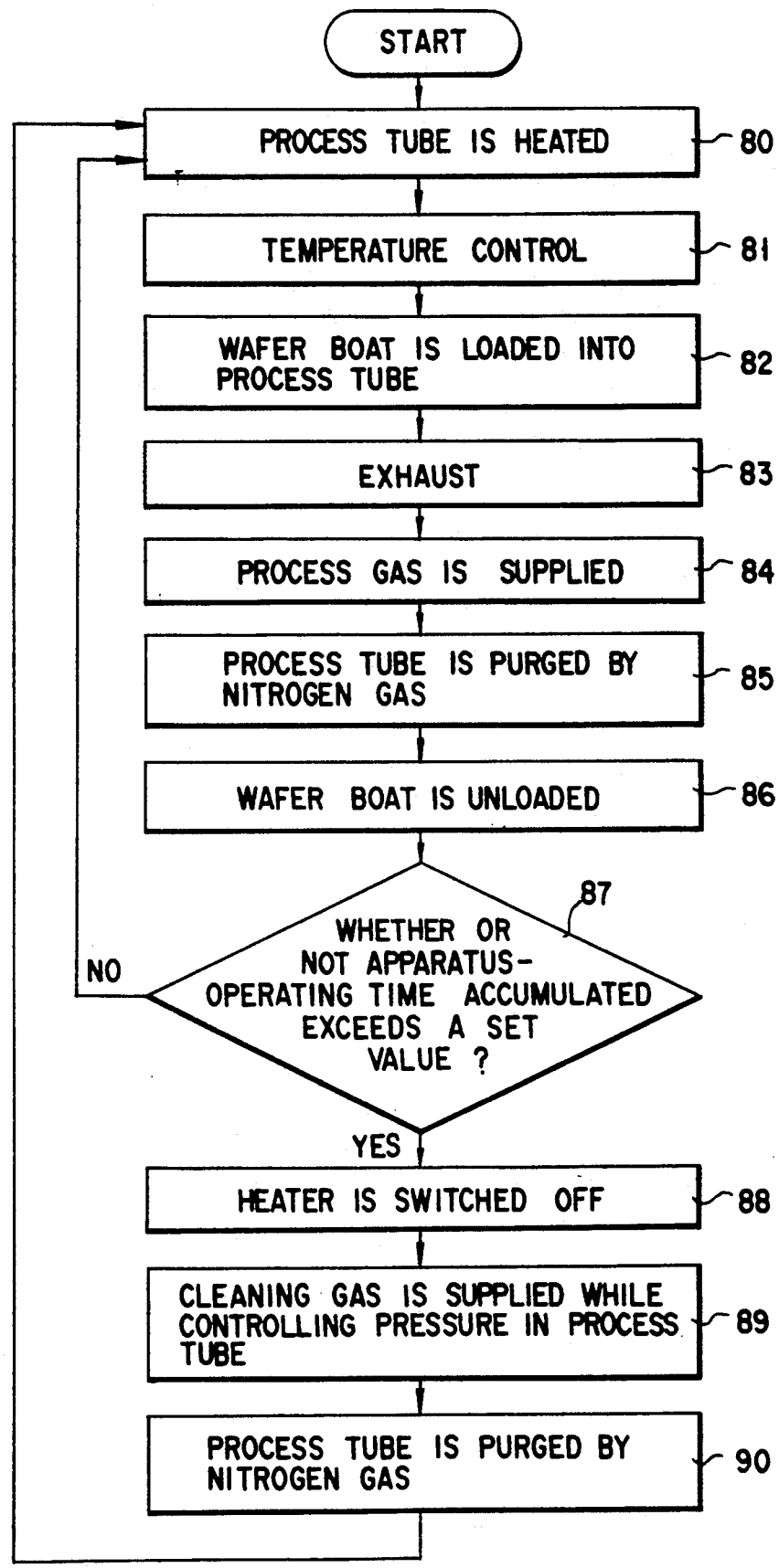
FIG. 2 is a flow chart intended to explain film-forming and cleaning processes.

The film forming process and a cleaning process in the above-described horizontal CVD apparatus will be described with reference to FIG. 2.

The film forming process will be described at first.

Figure 3:
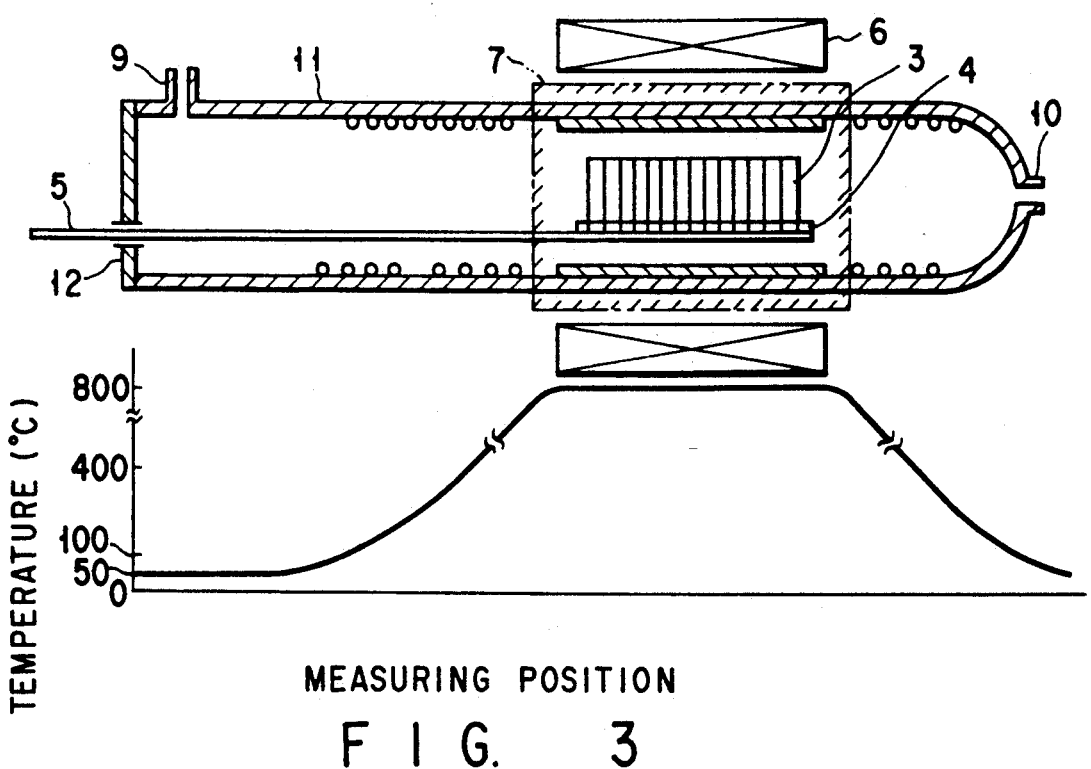
FIG. 3 shows a temperature distribution in the process tube during the film-forming process.

Nitrogen gas is purged from the process tube 11. When the process tube 11 is heated by the heater 6, a temperature profile as shown in FIG. 3 is formed in the process tube 11 after the lapse of a predetermined time period (Step 80). The amount of current supplied to the heater 6 is controlled by a controller (not shown) which is backed up by a computer system. Temperature in the process tube 11 can be thus raised to predetermined value suitable for the film forming process (Step 81). This process temperature ranges from 600° C. to 850° C., depending upon processing requisites such as film thickness. In this case, 800° C. is used as the temperature suitable for forming $SiO_2$, film on silicon wafers W.

The wafer boat 4 is located, as shown in FIG. 3, at the uniformly-heated zone 7 in the process tube 11 (Step 82). When the wafer boat 4 is loaded like this, the opening 8 of the process tube 11 is closed by the cap 12 so that the process tube 11 can be kept air-tight. The process tube 11 is exhausted to reduce its internal pressure to about $1 \times 10^{-3}$ Torr (Step 83).

The valve 23 is turned open and monosilane gas ($SiH_4$) is introduced from the process gas supply section 21 into the process tube 11 at a rate of 300 cc/min. Furthermore, $N_2O$ gas into the process tube 11 at a rate of 20 l/min. When this mixture of gases is supplied in this manner only for a predetermined time, it reacts with heat to develop a layer of an amorphous compound ($SiO_2$) on each of the wafers W. This is called HTO process (Step 84).

Contaminants 14 adhere to the inner wall 13 of the process tube 11 at the HTO process. More specifically, amorphous silicon dioxide ($SiO_2$) adheres to the inner wall 13 of the uniformly-heated zone 7. On the other hand, a relatively large amount of poly-silicon (Poly-Si) or amorphous silicon (Si) adheres to the inner wall 13 of the zone except for the uniformly-heated zone 7.

The inventors have found out that, poly-silicon (Poly-Si) and amorphous silicon (Si) are quite different from quartz and SiC in coefficient of liner expansion, and their films adhering to the inner wall 13 are therefore likely to cause cracks. Particularly in the case of the products 14 adhering to other portion zone except for the uniformly-heated zone 7 of the inner wall 13, at a temperature lower than that in the uniformly-heated zone 7, their adhering force is smaller so that they can more easily peel off and drop the inner wall 13. They are therefore more likely to scatter, as particles, in the process tube 11, thereby causing the wafers to be contaminated.

The supply of the process gas into the process tube 11 is stopped and nitrogen gas is introduced into the process tube 11 while exhausting the remaining-in-tube gases out of the process tube 11 (Step 85). The internal pressure in the process tube 11 is thus made substantially equal to atmospheric pressure.

The wafer boat 4 is unloaded from the process tube 11 (Step 86). The wafer boat 4 thus unloaded is transferred to a predetermined stage or the film-formed wafers W are transferred from the unloaded wafer boat 4 onto a wafer carrier (not shown). Wafers W to be processed are then newly mounted on the wafer boat 4.

After the film forming process is finished one time or certain times, the cleaning process which comprises steps 88–90 is started to remove contaminants 14 such as poly-silicon (Poly-Si) and amorphous silicon (Si) from the process tube 11, the wafer boat 4 and the fork 5.

Various kinds of data obtained from the CVD apparatus of the horizontal type are inputted into the computer system (not shown) and the operating time period of the CVD apparatus is accumulated on the basis of these data inputted. It is then checked by the computer system whether or not the value thus accumulated of the operating time exceeds a value previously set (Step 87). The times at which the use of the apparatus is repeated may be used as the checking material in this case, instead of using the accumulated value of the apparatus-operating time period.

When it is found "NO" in the above check, command signal is sent from the computer system to a controller (not shown) to control the temperature in the process tube 11 (Step 81). The steps 82–86 are then repeated to film-forming process new wafers W which are to be processed.

When it is found "YES", the heater 6 is switched off (Step 88). The process tube 11 is left cooled to lower the temperature in its uniformly-heated zone to room temperature.

Figure 4:
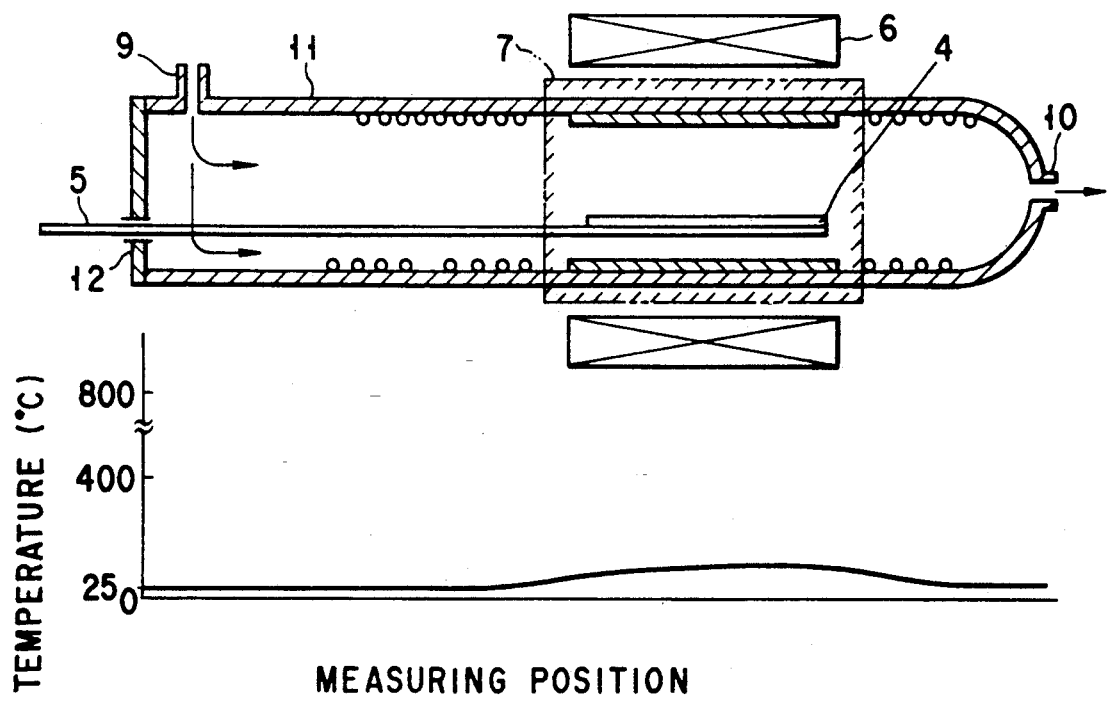
FIG. 4 shows a temperature distribution in the process tube during the cleaning process.

As shown in FIG. 4, the empty wafer boat 4 is loaded into the process tube 11 to close the open bottom 8 of the process tube 11 by the cap 12. The process tube 11 is thus sealed.

The process tube 11 thus air-tightly sealed is exhausted to about 0.001 Torr. The valve 24 is turned open. Chlorine trifluoride ($ClF_3$) gas diluted by oxygen gas of about 5 volume % is supplied from the gas supply section 22 into the process tube 11 while controlling the MFCs 27 and 28. This cleaning gas is supplied into the process tube 11 at a rate of 500 cc per minute (Step 89). The process tube 11 is kept exhausted at an appropriate rate for this while. The inner pressure of the process tube 11 must be a predetermined constant pressure within a range of 0.1 to 0.2 Torr, because the rate of etching the contaminants 14 on the inner wall 13 of the process tube 11 is greatly affected by the cleaning gas supplied.

Chlorine trifluoride ($ClF_3$) included in the cleaning gas etches amorphous silicon (Si) on the inner wall 13, the wafer boat 4 and the fork 5. Particularly those contaminants 14 which have adhered to that portion of the inner wall 13 which is not in the uniformly-heated zone 7 can be removed by the etching of the cleaning gas, so the occurrence of particles in the process tube 11 can be effectively prevented. The contaminants thus etched are exhausted, together with waste gases, outside of the process tube 11 through the exhaust outlet 10.

Amorphous silicon oxide ($SiO_2$) which has adhered to the inner wall 13 in the uniformly-heated zone 7 can be hardly etched this time, but poly-silicon (Poly-Si) and amorphous silicon (Si) deposited to that portion of the inner wall 13 which is between the opening 8 of the process tube 11 and the front area of the uniformly-heated zone 7 can be etched. When the step 89 is kept for a certain time period, the film of low density stuck to the inner wall 13 of the process tube 11 and others can be fully eliminated.

The supply of the cleaning gas into the process tube 11 is stopped and nitrogen gas is supplied to fill the process tube 11 (Step 90). The power supply of the heater 6 is then switched on to heat the process tube 11 and the film forming process which comprises steps 81–87 is repeated.

According to the above-described cleaning method, it is not needed that the etching gas is made plasma, as seen in the conventional methods. This enables various kinds of disadvantages to be eliminated. In the case where carbon is decomposed by plasma gas and the matters 14 on the inner wall 13 of the process tube 11 are removed by this decomposed compound, for example, the temperature profile is disturbed by the plasma generating power sources added and the control of apparatus operation is more complicated. According to the above-described cleaning method of the present invention, however, the temperature profile is not disturbed. In addition, the apparatus can be smaller-sized because the plasma generating system is not needed.

Although $O_2$ gas has been used to dilute $ClF_3$ gas in the above-described case, $N_2$, Ar or $CF_4$ gas may be used as dilution and carrier gas.

The inventors formed films of Poly-Si, $Si_3N_4$ and thermal $SiO_2$ on sample wafers and simulatingly checked how these three kinds of film were etched under different conditions. The conditions were set that the atmosphere around the wafers in the process tube was reduced to 1.3 Torr and that $ClF_3$ of 200 cc/min. and $N_2$ gas of 1800 cc/min. were introduced into this pressure-reduced atmosphere. Results thus obtained relating to rates of the films etched at different temperatures were shown in Table 1.

TABLE 1

| Temperature | 400° C. | 600° C. | 800° C. |
| --- | --- | --- | --- |
| Poly-Si | 1000 | 3000 | 10000 |
| $Si_3N_4$ | 70 | 800 | 2500 |
| Thermal $SiO_2$ | None | 30 | 150 |

The unit of each value in Table 1 was shown in the term of Angstrom per minute (A/min).

Another case where the present invention is applied to the CVD apparatus of the vertical type will be described as a second embodiment of the present invention.

Figure 5:
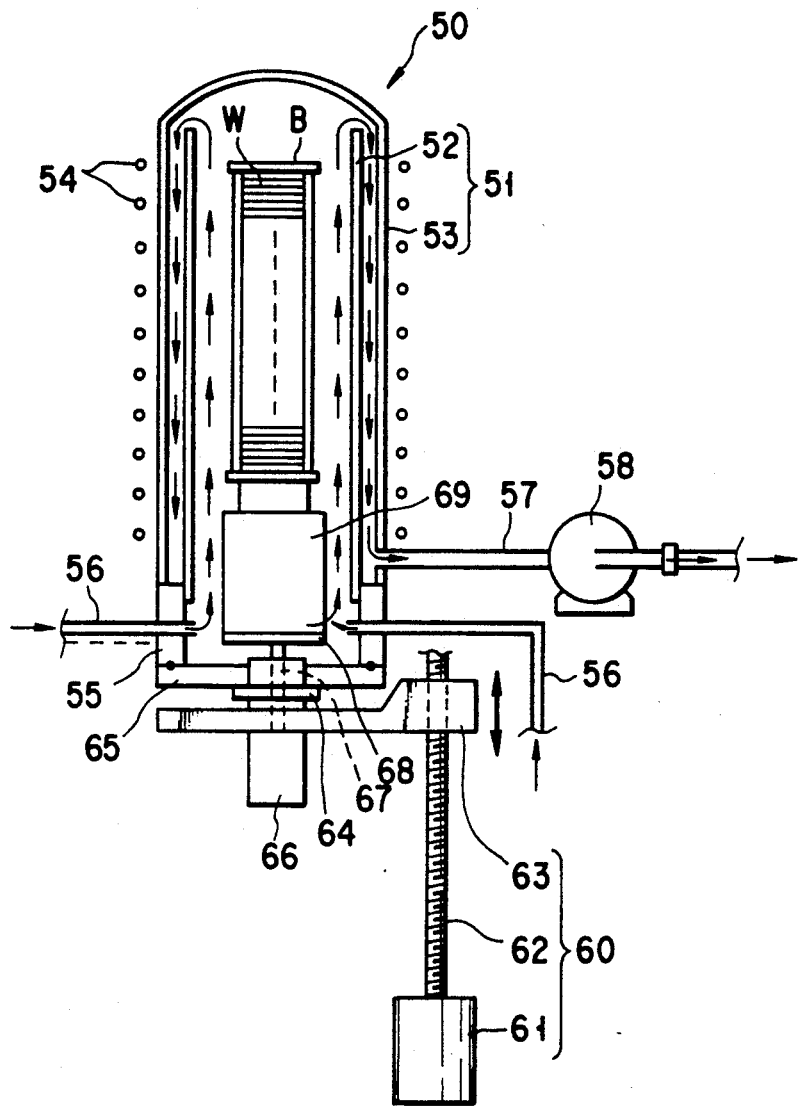
FIG. 5 is a vertically-sectioned view showing a process tube of the vertical type CVD apparatus and systems attached to it.

As shown in FIG. 5, a process tube 51 of this vertical CVD apparatus 50 is enclosed by heaters 54 and is surrounded with insulating material (not shown). The process tube 51 comprises an outer tube 53 made of quartz and an inner tube 52 also made of quartz and concentrically housed in the outer tube 53 with a certain interval interposed between them.

A disk-like cap 65 is fitted into the bottom opening of the process tube 51, which is thus sealed by the cap 65. A rotating shaft 67 is passed through the cap 65 in such a way that it can be supported freely rotatable and air-tight by a magnetic fluid seal (not shown). A support plate 68 is attached to the upper end of the rotating shaft 67 while the driving shaft of a motor 66 is connected to the lower end of the rotating shaft 67.

A heat insulating sleeve 69 is mounted on the support plate 68 and a quartz-made wafer boat B is mounted on the heat insulating sleeve 69. A plurality of silicon wafers W are housed in the wafer boat B at a certain pitch.

A plate 63 of a lifter system 60 is connected to center member 64 of the cap 65. The nut of the plate 63 is engaged with a screw 62. The lower end of the screw 62 is connected to the driving shaft of a motor 61. When the screw 62 is rotated, the wafer boat B, the heat insulating sleeve 69 and the cap 65 are moved up and down as a unit.

Plural gas pipes 56 are attached to a lower manifold 55 of the process tube 51. The gas outlet of each gas pipe 56 is made open inside the inner tube 52. The gas pipes 56 are communicated with reactive and cleaning gases supply pipe lines (not shown) through a pronged pipe (not shown).

The cleaning gas supply pipe line has $ClF_3$ and $N_2$ gases supply sources. $N_2$ gas is used as carrier and diluting gas and $ClF_3$ gas as etching gas.

A mass flow controller is attached to each of the gases supply sources. $ClF_3$ gas is diluted to a predetermined concentration by $N_2$ ga while adjusting the mass flow controllers. This mixture of these gases which has been diluted to the predetermined concentration is supplied from the cleaning gas supply pipe line into the process tube 51 through the gas pipes 56.

The exhaust outlet of an exhaust pipe 57 is communicated with the process tube 51 at the lower portion thereof. The other end of the exhaust pipe 57 is communicated with a vacuum pump 58 at the sucking side thereof and gases introduced into the process tube 51 is exhausted outside through the exhaust pipe 57. It is preferable that the vacuum pump 58 used is of the oil-free type. This is because $ClF_3$ is used as cleaning gas. When the pump of the wet type is used in this case, the probability is high that pump oil is deteriorated and that the pump itself is damaged by chlorine and fluorine mixed in oil.

Attached to the exhaust pipe line of the pump 58 is a means for removing harmful and dangerous gas components from those $ClF_3$-containing gases exhausted from the pump 58 through the exhaust pipe line thereof. The removing means houses a medicine sleeve therein to suck or decompose the harmful and dangerous gas components.

According to the above-described second embodiment of the present invention, the process tube 51 is purged by nitrogen gas to reduce its internal pressure to atmospheric pressure after the film forming process is finished. $ClF_3$ gas of 200 cc/min. and nitrogen gas of 1800 cc/min. is then introduced into the process tube 51. Inner pressure of the process tube 51 is made about 1 Torr. Contaminants which have adhered to the inner wall of the process tube 51, particularly inner wall of the manifold 55, can be thus etching-removed.

Although the cleaning gas has been continuously supplied into the process tube in the above-described cases, it may be supplied, like pulses or intermittently, into the process tube. Or it may be supplied into the process tube in such a way that it can create turbulence in the process tube.

When ultrasonic waves are applied to the process tube at least during the supply of the cleaning gas into the process tube, the cleaning of the process tube can be achieved at a higher speed. When strong and weak ultrasonic waves are applied alternately to the process tube, the cleaning can be achieved at by far the higher speed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A cleaning method for removing a low density silicon-based film adhered to an inner wall of a ceramic process tube in a process of forming a silicon-based film on a semiconductor wafer, comprising the steps of:

taking a wafer having a silicon-based film formed thereon out of said process tube; then controlling the temperature within the process tube to fall within a range of between 400° C. and the boiling point of $ClF_3$;

supplying, while the temperature is controlled to be below 400° C., a cleaning gas containing $ClF_3$ into the process tube to allow said cleaning gas to react with said low density silicon-based film; and releasing the gaseous material from the process tube.

2. A method according to claim 1, further comprising:

supplying said cleaning gas in the process tube and making internal pressure in the process tube negative while exhausting the process tube through an exhaust means; and reacting said cleaning gas with mono-crystal-silicon, poly-crystal-silicon and/or amorphous silicon which have/has adhered, during the $SiO_2$ film forming process, to the inner wall of zones, other than uniformly heated zone.

3. The method according to claim 2, wherein a dry pump of the oil-free type is used as the exhaust means.

4. The method according to claim 1, wherein a heating power supply is switched off to lower the temperature in the process tube substantially to room temperature and the cleaning gas is then supplied into the process tube.

5. The method according to claim 1, wherein the cleaning gas includes at least one of oxygen gas, nitrogen gas, argon gas and $CF_4$ gas.

6. The method according to claim 1, wherein the process tube is made of quartz.

7. A method according to claim 1, wherein the process tube walls comprise silicon dioxide.

8. A method according to claim 1, further comprising the step of:

ultrasonically vibrating the process tube while $ClF_3$ is inside the process tube.

9. A method according to claim 8, wherein ultrasonically vibrating further comprises applying strong and weak ultrasonic waves.

10. A method of heat-treating a semiconductor wafer within a process tube, comprising the steps of:

forming a silicon-based film on a semiconductor wafer and taking said wafer having a silicon-based film formed thereon out of said process tube; then controlling the temperature within the process tube to fall within a range of between 400° C. and the boiling point of $ClF_3$;

supplying, while the temperature is controlled to be below 400° C., a cleaning gas containing $ClF_3$ into the process tube to allow said cleaning gas to react with a low density silicon-based film adhered to said process tube during formation of the silicon-based film on said wafer; and releasing the gaseous material from the process tube.

11. The method according to claim 1 or 10, wherein the inner pressure of the process tube is controlled to fall within a range of between 0.1 to 2 Torr in the step of supplying said cleaning gas into said process tube.

12. The method according to claim 1 or 10, further comprising the step of calculating a cumulative operating time of said process tube before the step of controlling the temperature within the process tube, said cleaning gas being supplied to the process tube when the cumulative operating time has been found to exceed a certain value.

13. The method according to claim 10, wherein a film-forming treatment is applied within said process tube to a plurality of wafers supported by a boat means.

14. The method according to claim 1 or 10, further comprising the step of transferring a wafer support member supporting wafers within said process tube into the process tube before the step of taking the wafer having a film-forming treatment applied thereto out of the process tube.

* * * * *